(12) United States Patent
Anton Falcon et al.

(10) Patent No.: US 10,412,790 B2
(45) Date of Patent: Sep. 10, 2019

(54) COOKING APPLIANCE

(71) Applicant: BSH Hausgeräte GmbH, Munich (DE)

(72) Inventors: Daniel Anton Falcon, Saragossa (ES);
Pablo Jesus Hernandez Blasco, Cuarte de Huerva (ES); Sergio Llorente Gil, Saragossa (ES); Diego Puyal Puente, Saragossa (ES)

(73) Assignee: BSH Hausgeräte GmbH, Munich (DE)

( * ) Notice: Subject to any disclaimer, the term of this patent is extended or adjusted under 35 U.S.C. 154(b) by 183 days.

(21) Appl. No.: 15/039,935

(22) PCT Filed: Dec. 12, 2014

(86) PCT No.: PCT/IB2014/066829
§ 371 (c)(1),
(2) Date: May 27, 2016

(87) PCT Pub. No.: WO2015/092636
PCT Pub. Date: Jun. 25, 2015

(65) Prior Publication Data
US 2017/0006667 A1  Jan. 5, 2017

(30) Foreign Application Priority Data

Dec. 17, 2013 (ES) .................................. 201331841

(51) Int. Cl.
*H05B 6/00* (2006.01)
*H05B 6/06* (2006.01)
(Continued)

(52) U.S. Cl.
CPC .......... *H05B 6/062* (2013.01); *G01R 15/181* (2013.01); *G01R 19/0092* (2013.01)

(58) Field of Classification Search
CPC ............... H05B 6/00; H05B 6/02; H05B 6/04
(Continued)

(56) References Cited

U.S. PATENT DOCUMENTS 4,055,740 A * 10/1977 Nakamura ............ H02M 7/523
                                                       219/624
4,074,101 A *  2/1978 Kiuchi .................... H02M 5/22
                                                       219/601
(Continued)

FOREIGN PATENT DOCUMENTS

| WO | 9746891 A1 | 12/1997 |
| WO | 9953331 | 10/1999 |

(Continued)

OTHER PUBLICATIONS

International Search Report PCT/IB20141066829 dated Mar. 24, 2015.

*Primary Examiner* — Dana Ross
*Assistant Examiner* — Ayub A Maye
(74) *Attorney, Agent, or Firm* — Michael E. Tschupp; Andre Pallapies; Brandon G. Braun

(57) ABSTRACT

A cooking appliance apparatus includes at least one current supply line, and at least one current sensor unit configured to measure a high-frequency current in the at least one current supply line. The at least one current sensor has a first sensor inductance, at least one second sensor inductance, and at least one conduction path, which connects the first sensor inductance to the at least one second sensor inductance in an electrically conducting manner.

23 Claims, 4 Drawing Sheets

(51) Int. Cl.
　　　*G01R 15/18*　　　(2006.01)
　　　*G01R 19/00*　　　(2006.01)

(58) Field of Classification Search
　　　USPC ....... 219/600, 625, 626, 660, 661, 663, 664,
　　　　　　　　　　　　　　　　　　　　　　　　　219/665, 666
　　　See application file for complete search history.

(56) References Cited

U.S. PATENT DOCUMENTS

| | | | | |
|---|---|---|---|---|
| 4,210,792 A | | 7/1980 | Higuchi | |
| 4,540,866 A | * | 9/1985 | Okuda | H05B 6/062 219/626 |
| 4,820,891 A | * | 4/1989 | Tanaka | H03L 5/02 219/626 |
| 4,858,099 A | * | 8/1989 | McMillan | H02M 3/338 363/131 |
| 5,648,008 A | * | 7/1997 | Barritt | H05B 6/062 219/626 |
| 5,793,196 A | * | 8/1998 | White | H01F 38/28 324/117 R |
| 6,018,154 A | * | 1/2000 | Izaki | H02M 7/537 219/625 |
| 6,094,043 A | * | 7/2000 | Scott | G01R 15/181 324/117 R |
| 6,717,397 B2 | * | 4/2004 | Sorenson, Jr. | G01R 15/181 324/117 R |
| 7,129,692 B2 | * | 10/2006 | Omura | G01R 19/0092 324/117 R |
| 7,420,828 B2 | * | 9/2008 | Ishio | H05B 6/08 219/663 |
| 9,572,201 B2 | * | 2/2017 | Oh | H05B 6/065 |
| 2012/0043312 A1 | * | 2/2012 | Lee | H05B 6/062 219/622 |
| 2012/0152935 A1 | * | 6/2012 | Kitaizumi | H05B 6/065 219/661 |
| 2012/0321761 A1 | * | 12/2012 | De la Cuerda Ortin | H05B 6/062 426/231 |

FOREIGN PATENT DOCUMENTS

WO　　　　0179869 A1　　10/2001
WO　　2007075617 A2　　7/2007

* cited by examiner ial Application No. PCT/IB2014/066829, filed Dec. 12,
COOKING APPLIANCE

CROSS-REFERENCES TO RELATED APPLICATIONS

This application is the U.S. National Stage of International Application No. PCT/IB2014/066829, filed Dec. 12, 2014, which designated the United States and has been published as International Publication No. WO 2015/092636 and which claims the priority of Spanish Patent Application, Serial No. P201331841, filed Dec. 17, 2013, pursuant to 35 U.S.C. 119(a)-(d).

BACKGROUND OF THE INVENTION

Induction cooktops are known from the prior art, which comprise a heating coil and a current sensor with an individual sensor inductance, which is provided to measure a high-frequency heating current in a current supply line to the heating coil.

BRIEF SUMMARY OF THE INVENTION

It is the object of the invention in particular to provide a generic apparatus with improved current measurement properties. According to the invention the object is achieved by the characterizing features of the independent claim, while advantageous embodiments and developments of the invention will emerge from the subclaims.

The invention is based on a cooking appliance apparatus, in particular a cooktop apparatus, with at least one current sensor unit, which is provided to measure a high-frequency current in at least one current supply line and which has a first sensor inductance.

It is proposed that the at least one current sensor unit has at least one second sensor inductance and at least one conduction path, which connects the first sensor inductance to the at least one second sensor inductance in an electrically conducting manner.

A "cooking appliance apparatus" refers in particular to at least one part, in particular a subassembly, of a cooking appliance, in particular of a cooktop and preferably of an induction cooktop. In particular the cooking appliance apparatus can also comprise the entire cooking appliance, in particular the entire cooktop and preferably the entire induction cooktop. In particular the cooking appliance apparatus comprises at least one inverter and at least one inductor. The at least one inverter is provided to supply the high-frequency current for the at least one inductor. A "high-frequency current" here refers in particular to a current with a frequency of at least 1 kHz, advantageously at least 10 kHz, preferably at least 20 kHz and particularly preferably maximum 100 kHz. In particular the high-frequency current flows through the at least one inductor in at least one operating state and is provided in particular to heat, in particular cookware, in particular by means of eddy current and/or magnetization change effects. In this context a "current supply line" refers in particular to an electrically conducting connection, which is in particular part of the cooking appliance apparatus and which is provided to carry the high-frequency current at least in one operating state and in particular to supply it to the at least one inductor. The at least one current supply line here preferably connects at least the at least one inverter, in particular indirectly and/or directly, to the at least one inductor. The conduction path, which is provided to connect the one first sensor inductance to the at least one second sensor inductance in an electrically conducting manner, can have in particular solder, a wire and/or a part, in particular a discrete part, preferably an SMD part, here. In particular the at least one current sensor unit can also have a larger number of sensor inductances, preferably an even number of sensor inductances, in particular 4, 6 or 8 sensor inductances. Additionally the at least one current sensor unit can have at least one amplifier element, which is provided to increase an inductance of at least one of the sensor inductances. The at least one amplifier element here is preferably arranged in the center and/or in proximity to one of the sensor inductances. The at least one amplifier element here is made particularly of a magnetic, preferably ferrimagnetic or ferromagnetic, material. "Proximity" also refers in particular to a spatial region, the points of which are at a distance of maximum 100 mm, advantageously maximum 50 mm, preferably maximum 10 mm and particularly preferably maximum 5 mm, from a reference point. A "sensor inductance" in this context refers in particular to an electrically conducting unit and/or an electrically conducting element, in which a magnetic flux density changes causes an, in particular proportional, electric field, in particular an electric voltage, to be induced. In particular at least essentially every region and/or part of the sensor inductance has an aligned effect, in particular induction voltage, these in particular being cumulative. The sensor inductance can also in particular have a fixed and/or settable inductance value. The sensor inductance here can be configured in particular as at least one conductor loop, at least one balun, at least one throttle and/or at least one transformer. The at least one sensor inductance is preferably configured as at least one coil, preferably just one coil, which can be in particular arranged, preferably printed, on a printed circuit board. In this case in particular a hypothetical current flow through the at least one sensor inductance has an aligned mathematical rotation direction at least essentially in every region and/or part. In particular the sensor inductance here can have a number of electrically conducting elements, which are in particular connected in such a manner that individual effects of the electrically conducting elements are cumulative. Alternatively or additionally a sensor inductance can be formed from a single element. In this case the sensor inductance is formed in particular from a single cohesive electrically conducting element and is therefore free of division points. In this case in particular the sensor inductance is formed from a single material. That "at least essentially" every region and/or part of the sensor inductance has an aligned effect means in particular that at least 85%, advantageously at least 90%, preferably at least 95% and particularly preferably at least 98%, of a volume component of the sensor inductance has an aligned effect. Advantageously the entire sensor inductance apart from connecting points has an aligned effect. A "hypothetical current flow" here refers in particular to a fictional current flow which would result in particular if a current source were connected to at least one of the sensor inductances. That "at least essentially" every region and/or part of the at least one sensor inductance has an aligned mathematical rotation direction means in particular that at least 85%, advantageously at least 90%, preferably at least 95% and particularly preferably at least 98%, of a volume component of the sensor inductance has an aligned rotation direction. Advantageously the entire sensor inductance apart from connecting points has an aligned rotation direction.

This allows improved current measurement in particular to be achieved. An advantageously improved shielding capacity, in particular from other electric and/or magnetic fields, of the at least one current sensor unit in particular is also permitted and measurement accuracy can advantageously be increased. The current sensor unit can also have an advantageously simple structure, thus reducing the space requirement and lowering costs.

Advantageously a first magnetic field, generated by a hypothetical current flow through the first sensor inductance, cancels out a second magnetic field generated by the hypothetical current flow, in particular the same hypothetical current flow, through the at least one second sensor inductance, at least at one point. In this case in particular the current source, the first sensor inductance, the at least one conduction path and the at least one second sensor inductance would form a conductor loop. A magnetic field generated in this case by the hypothetical current flow through the first sensor inductance is aligned in particular in such a manner here that it attenuates a magnetic field generated by the hypothetical current flow through the at least one second sensor inductance and in particular cancels it out at least at one point. The expression that a magnetic field "cancels out" another magnetic field means in particular here that an effective magnetic field formed in particular from a superimposition of the at least two individual magnetic fields, disappears in particular at least at one point, preferably a point in a three-dimensional space. The specific arrangement of the at least one first sensor inductance and the at least one second sensor inductance in particular allows a shielding capacity, in particular from other electric and/or magnetic fields, of the at least one current sensor unit to be increased.

It is further proposed that the first sensor inductance and the at least one second sensor inductance have at least essentially identical inductance values. The expression that two sensor inductances have "at least essentially identical inductance values" in this context means that a relative deviation of an inductance value of a first sensor inductance from an inductance value of a second sensor inductance is maximum 20%, advantageously maximum 10%, preferably maximum 5% and particularly preferably maximum 1%. This allows an advantageously simple structure to be achieved. Also measurement accuracy can be advantageously increased.

In one advantageous embodiment of the invention it is proposed that the first sensor inductance and the at least one second sensor inductance are at least essentially identical. That two sensor inductances are "at least essentially identical" means in particular that the two sensor inductances are identical with a volume component of at least 70%, advantageously at least 80%, preferably at least 90% and particularly preferably at least 95%. This allows in particular an optimum and advantageously simple embodiment of the at least two sensor inductances to be achieved. Also the at least two sensor inductances can advantageously be produced in the same manner, thus saving costs in particular.

It is further proposed that the first sensor inductance and the at least one second sensor inductance are connected antiserially. That the first sensor inductance and the at least one second sensor inductance are connected "antiserially" means in particular that an output connection of the first sensor inductance is connected, in particular serially, to an output connection of the at least one second sensor inductance and/or that an input connection of the first sensor inductance is connected, in particular serially, to an input connection of the at least one second sensor inductance. The antiserial connection is thus different in particular from a parallel connection of the first sensor inductance to the at least one second sensor inductance. In one preferred embodiment of the invention the first sensor inductance and the at least one second sensor inductance are each formed by at least one coil and/or just one coil. In this case the expression that the first sensor inductance and the at least one second sensor inductance are connected "antiserially" means in particular that the first sensor inductance and the at least one second sensor inductance are connected in such a manner that a hypothetical current flowing through the two sensor inductances has an opposing mathematical rotation direction when there is a hypothetical flow through the first sensor inductance to when there is a hypothetical flow through the at least one second sensor inductance. The first sensor inductance and the at least one second sensor inductance here preferably have an identical winding direction. This can simplify in particular the form of the at least two sensor inductances. Also a connection between the at least two sensor inductances can be configured in an advantageously simple manner and in particular a current flow in the at least two sensor inductances can be optimized.

If an outer contour of at least one of the at least two sensor inductances is configured as at least essentially cuboid, an embodiment of the at least one sensor inductance can be further simplified. An outer contour can also be matched in particular optimally to an environment, in particular a carrier unit. An "outer contour" of an object here refers in particular to an outer edge of the object, which terminates the object in particular in all spatial directions of a three-dimensional space and which encloses in particular a minimum volume content in the process. The expression "at least essentially cuboid" here means in particular that the outer contour of the object deviates by maximum 30%, advantageously maximum 20%, preferably maximum 10% and particularly preferably maximum 5%, from an outer contour of a cuboid.

In a further embodiment of the invention it is proposed that the at least one current supply line is arranged relative to the at least one current sensor unit in such a manner that a current flow through the at least one current supply line generates a magnetic field, the field lines of which point in an at least essentially opposing direction in the first sensor inductance and the at least one second sensor inductance. In particular the at least one current supply line here is arranged at least partially between the first sensor inductance and the at least one second sensor inductance, particularly when viewed in at least one direction. That the at least one current supply line is arranged "between" the first sensor inductance and the at least one second sensor inductance in this context means in particular that the at least one current supply line is arranged at least in one viewing direction between a first center of gravity of the first sensor inductance and a second center of gravity of the at least one second sensor inductance. A "center of gravity" of a sensor inductance here refers in particular to a center of mass. The current supply line is preferably arranged at least partially in proximity to a center of gravity center of the first center of gravity of the first sensor inductance and the second center of gravity of the at least one second sensor inductance. A "center of gravity center" here refers in particular to an effective center of gravity which results from adding together position vectors of the first center of gravity of the first sensor inductance and the second center of gravity of the at least one second sensor inductance. That field lines in the first sensor inductance and the at least one second sensor inductance point in an "at least essentially opposing direction" means in particular that an angle between tangential directions of the field lines, in particular tangential directions of the field lines which intersect the first sensor inductance and the at least one second sensor inductance at least essentially at an angle of 90°, is between 170° and 190°, preferably between 175° and 185° and particularly preferably between 179° and 181°. The expression intersect "at least essentially" at an angle of 90° in this context means in particular an angle deviation of maximum 5°, preferably maximum 3° and particularly preferably maximum 1° from an angle of 90°. A current flow through an external current conductor preferably generates a magnetic field, the field lines of which point in an at least essentially identical direction in the first sensor inductance and the at least one second sensor inductance, with the result that a voltage induced in the at least one current sensor unit is at least essentially canceled out. In this context an "external current conductor" refers in particular to a current conductor, which is different in particular from the at least one current supply line and which runs at least essentially perpendicular to at least one subregion, preferably a subregion which is in proximity to the center of gravity center, of the at least one current supply line, and/or is at least at a distance from the at least one current sensor unit, preferably from an outer contour of the at least one current sensor unit, of at least 5 mm, preferably 25 mm and particularly preferably 50 mm. That field lines in the first sensor inductance and the at least one second sensor inductance point in an "at least essentially identical direction" means in particular that an angle between tangential directions of the field lines, in particular tangential directions of the field lines which intersect the first sensor inductance and the at least one second inductance at least essentially at an angle of 90°, in particular when viewed in a coordinates axis, is maximum 10°, preferably maximum 5° and particularly preferably maximum 1°. The expression "at least essentially canceled out" in this context means in particular that a magnetic field detected and/or measured in the at least one sensor unit when there is a current flow through the external current conductor corresponds to maximum 60%, advantageously maximum 30%, preferably maximum 10% and particularly preferably maximum 1% of a magnetic field that can be detected and/or measured in the at least one sensor unit when there is a current flow through the at least one current supply line. That a current conductor runs "at least essentially perpendicular" to an object in this context means in particular that a longitudinal extension direction of the current conductor forms an angle between 70° and 110°, preferably between 80° and 100° and particularly preferably between 85° and 95° with a longitudinal extension direction of the object. In this context a "longitudinal extension direction" of an object refers in particular to a direction of a greatest possible extension of the object. An "extension" of an object in one direction in this context refers in particular to a maximum distance between two points of a perpendicular projection of the object onto a plane arranged parallel to the direction. This improves in particular the sensitivity of a current measurement and advantageously further increases measurement accuracy.

It is further proposed that a first center of gravity of the first sensor inductance and a second center of gravity of the at least one second sensor inductance are at an at least essentially identical, in particular minimum, distance from at least one cross-sectional center point of the at least one current supply line. That a first center of gravity and a second center of gravity are at an "at least essentially" identical distance from at least one cross-sectional center point of the at least one current supply line means in particular that the two distances differ by maximum 20%, advantageously maximum 10%, preferably maximum 5% and particularly preferably maximum 1% from one another. This advantageously simplifies current measurement and in particular an arrangement of the at least one current sensor unit and the at least one current line relative to one another.

The cooking appliance apparatus advantageously comprises at least one first printed circuit board, on which the at least one current supply line is at least partially arranged. The at least one first printed circuit board here can be configured in particular as a single-layer, two-layer and/or multilayer printed circuit board. The at least one current supply line here can be arranged in particular on one layer, preferably on an outer layer, of the at least one first printed circuit board, with the result that the board in particularly advantageously heats up to a lesser degree. Alternatively and/or additionally the at least one current supply line can be arranged in a distributed manner on a number of layers of the at least one printed circuit board. In this case the at least one current supply line preferably has at least one parallel connection between at least two different layers of the at least one first printed circuit board. This also means that the board heats up to a lesser degree. The at least one current supply line here is advantageously etched directly onto the at least one first printed circuit board. The at least one first printed circuit board here can be made of any material that appears expedient to the person skilled in the art, in particular FR1, FR2, FR3, FR4, FR5, CEM-1, CEM-3 and/or Teflon. This advantageously minimizes the space required. There is also no need for additional parts, thereby advantageously reducing costs. Accuracy and therefore reproducibility of the measurement results are also increased.

It is further proposed that the cooking appliance apparatus comprises at least one second printed circuit board, on which the at least one current sensor unit is at least partially arranged. The at least one second printed circuit board can be configured in particular as a single-layer, two-layer and/or multilayer printed circuit board. If the at least one second printed circuit board is configured as a multilayer printed circuit board, the at least one current sensor unit can be arranged in particular at least partially on an inner layer of the at least one second printed circuit board. In this case the shielding of the at least one current sensor unit can be advantageously increased. In this case the first sensor inductance and the at least one second sensor inductance are preferably arranged at least partially on the same layer, advantageously on the same inner layer, of the at least one second printed circuit board. Alternatively and/or additionally the at least one current sensor unit can be arranged on a number of layers of the at least one second printed circuit board. In particular the first sensor inductance and the at least one second sensor inductance can be arranged on a number of layers, preferably the same layers. This in particular increases measurement accuracy. The first sensor inductance and the at least one second sensor inductance are advantageously at least partially etched directly onto the at least one second printed circuit board and thus formed in particular at least partially from copper. The at least one second printed circuit board here can be made of any material that appears expedient to the person skilled in the art, in particular FR1, FR2, FR3, FR4, FR5, CEM-1, CEM-3 and/or Teflon. This further reduces the space required. It also allows a simple current sensor unit structure to be achieved.

The at least one first printed circuit board and the at least one second printed circuit board are advantageously configured as a single piece. "As a single piece" in this context means in particular at least connected with a material fit. The material fit can be produced for example by means of a bonding process and/or another process that appears expedient to the person skilled in the art. As a single piece however advantageously means formed in one piece. This one piece is preferably produced from a single blank, in particular from a single printed circuit board, which can in particular have a number of layers. This advantageously further minimizes the space required and in particular further reduces costs.

Further advantages will emerge from the description of the drawing which follows. The drawing shows three exemplary embodiments of the invention. The drawing, description and claims contain numerous features in combination. The person skilled in the art will also expediently consider the features individually and combine them in useful further combinations.

DETAILED DESCRIPTION OF EXEMPLARY EMBODIMENTS OF THE PRESENT INVENTION

Figure 1:
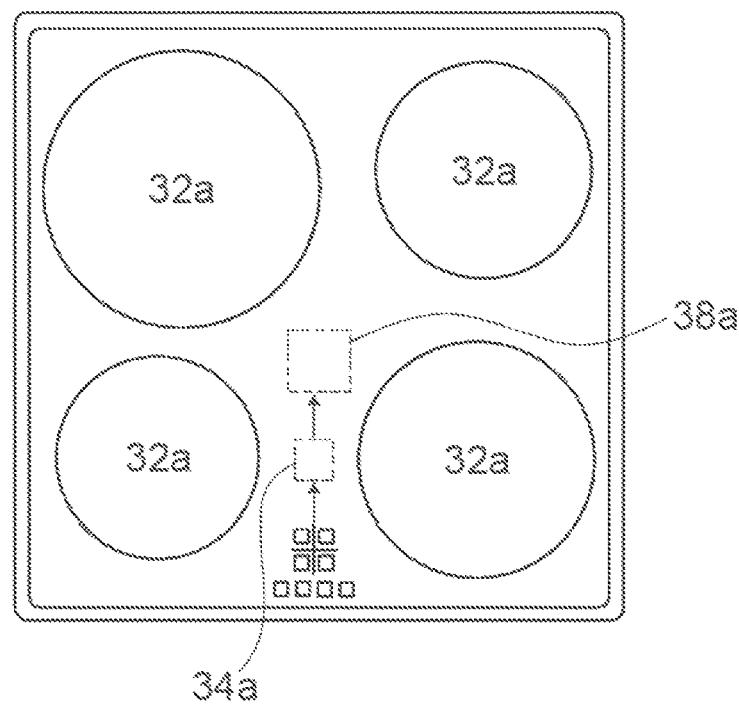
FIG. 1 shows a top view of a cooking appliance with an inventive cooking appliance apparatus.

FIG. 1 shows a top view of an exemplary cooking appliance with an inventive cooking appliance apparatus configured as a cooktop apparatus and having a number of cooking zones 32a and a control unit 34a. Each cooking zone 32a here is assigned at least one inductor 36a (see FIG. 2). Alternatively the cooking appliance can also be configured as a matrix cooktop with freely definable cooking zones. The cooking appliance apparatus also has a power module 38a which is provided to supply the inductors 36a with high-frequency alternating current.

Figure 2:
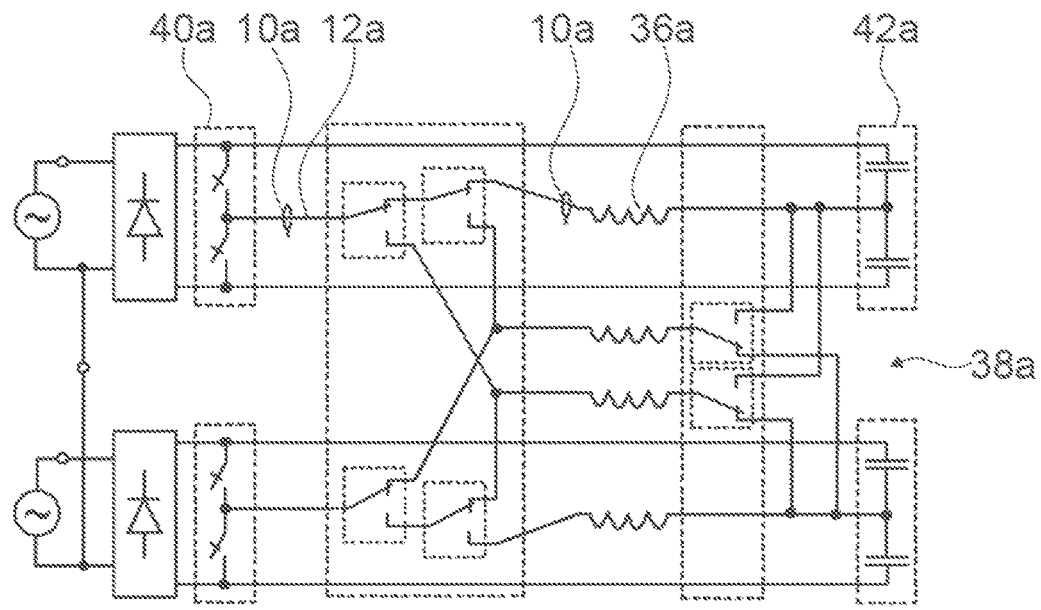
FIG. 2 shows a simplified circuit diagram of the cooking appliance apparatus from FIG. 1 with a current sensor unit.

FIG. 2 shows a simplified circuit diagram of the cooking appliance apparatus. The cooking appliance apparatus has at least one inverter 40a. The cooking appliance apparatus also has at least one inductor 36a. The cooking appliance apparatus also has at least one current supply line 12a. The cooking appliance apparatus furthermore has at least one resonance unit 42a. The inverter 40a, the current supply line 12a and the resonance unit 42a are part of the power module 38a. The inverter 40a and the inductor 36a are connected by way of the current supply line 12a. The cooking appliance apparatus also has at least one current sensor unit 10a. The current sensor unit 10a is provided to measure a high-frequency current in the current supply line 12a. FIG. 2 shows two conceivable positions for the current sensor unit 10a. The current sensor unit 10a is arranged between the inverter 40a and the inductor 36a. Alternatively at least one current sensor unit can also be arranged between an inductor and a resonance unit. The current sensor unit 10a is also part of the power module 38a. The cooking appliance apparatus can also comprise further units, in particular for example switching units, rectifiers and/or voltage converters, which in particular can also be part of the power module 38a.

Figure 3:
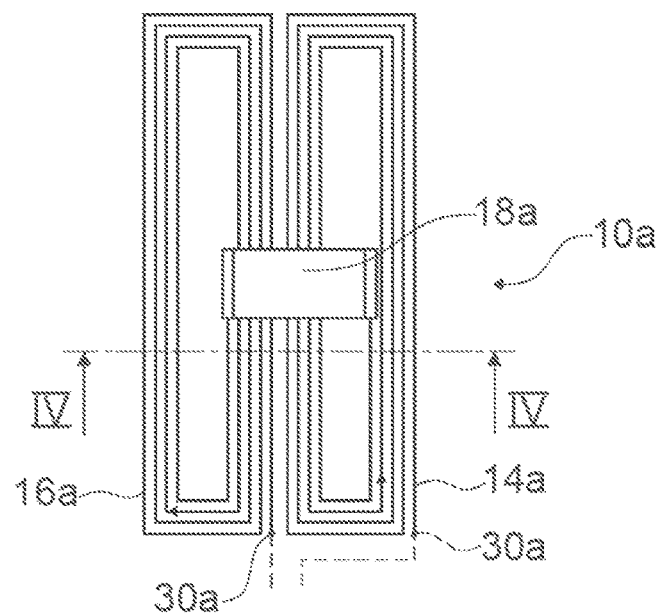
FIG. 3 shows a schematic representation of the current sensor unit.

FIG. 3 shows a schematic representation of the current sensor unit 10a. The current sensor unit 10a has a first sensor inductance 14a. The first sensor inductance 14a is configured as a coil, in particular as a flat coil. The first sensor inductance 14a here has between 1 and 15 windings. In the present case the first sensor inductance 14a has between 4 and 5 windings. The distance between the windings is between 0.15 mm and 0.5 mm. The first sensor inductance 14a has a mathematically negative rotation direction, in particular winding direction, when viewed in particular from the inside out. The first sensor inductance 14a has an outer contour which is configured as cuboid. Alternatively the first sensor inductance can also be configured as a spiral coil and/or a cylindrical and/or square coil. The first sensor inductance 14a is formed at least partially from an electrically conducting material. In the present case the first sensor inductance 14a is formed at least partially from copper. The first sensor inductance 14a is also configured as cohesive and is in particular free of division points. Alternatively the material used for the sensor inductance can be any electrically conducting materials that appear expedient to the person skilled in the art, in particular materials consisting at least essentially of copper. In particular the material has a copper component of at least 40%, advantageously at least 60%, preferably at least 80% and particularly preferably at least 95%.

The current sensor unit 10a also has a second sensor inductance 16a. The first sensor inductance 14a and the second sensor inductance 16a have identical inductance values. The first sensor inductance 14a and the second sensor inductance 16a are also configured identically to one another. The first sensor inductance 14a and the second sensor inductance 16a also each have a contact point 30a, which is provided in particular for contact with the first sensor inductance 14a and/or the second sensor inductance 16a.

The current sensor unit 10a also has a conduction path 18a. The conduction path 18a connects the first sensor inductance 14a to the second sensor inductance 16a in an electrically conducting manner. In the present case the conduction path 18a is formed by an SMD resistor. The conduction path 18a here is formed by a 0 ΩSMD resistor. Alternatively a conduction path can also be formed from solder and/or a wire, in particular a wire jumper. It is also conceivable for a conduction path to be formed at least partially by a conductor track, in particular on a rear face of a printed circuit board, it being possible for a first and second sensor inductance to be formed in particular on a front face of the printed circuit board. The conduction path 18a connects the first sensor inductance 14a to the second sensor inductance 16a in such a manner that the first sensor inductance 14a and the second sensor inductance 16a are connected antiserially. To this end a first end of the conduction path 18a is connected to an inner end of the first sensor inductance 14a. A second end of the conduction path 18a is also connected to an inner end of the second sensor inductance 16a. A distance between the first sensor inductance 14a and the second sensor inductance 16a is between 0.15 mm and 5 mm. In the present case the distance between the first sensor inductance 14a and the second sensor inductance 16a is 0.3 mm. In particular a putative current flowing through the two sensor inductances 14a, 16a would have an opposing mathematical rotation direction when there is a hypothetical flow through the at least one first sensor inductance 14a to when there is a hypothetical flow through the at least one second sensor inductance 16a. Thus a first magnetic field generated by a putative current flow through the first sensor inductance 14a would cancel out a second magnetic field generated by the putative current flow through the second sensor inductance 16a at least at one point, which corresponds to a center of gravity center 48a in this case at least.

Figure 4:
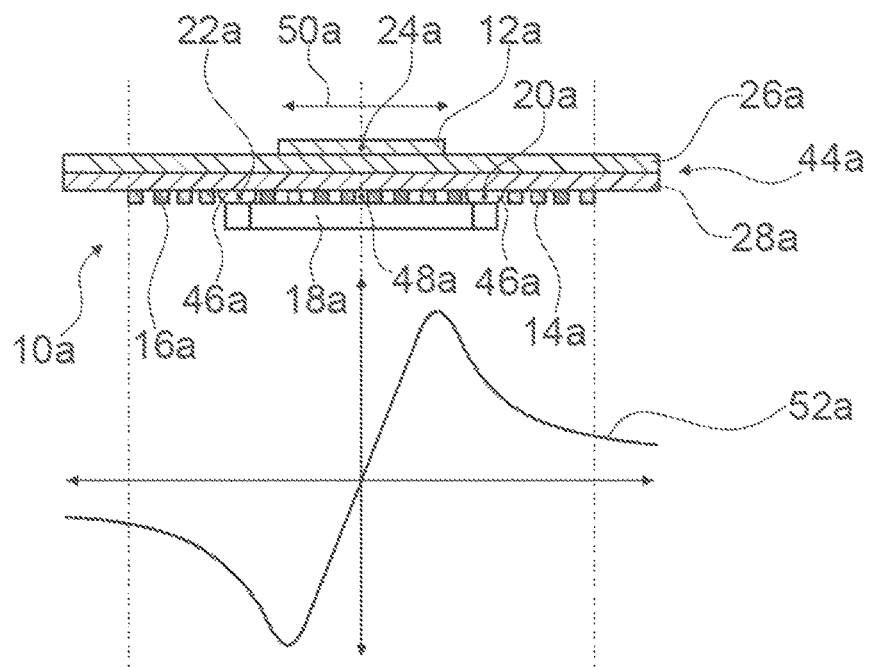
FIG. 4 shows a schematic sectional representation of the current sensor unit arranged on a printed circuit board along a line IV-IV in FIG. 3 and a diagram of a profile of a magnetic flux strength generated by a current flow in a current supply line.

According to FIG. 4 the cooking appliance apparatus has a first printed circuit board 26a. The first printed circuit board 26a has FR4 as its base material. In the present case the first printed circuit board 26a is configured as single-layer. The current supply line 12a from FIG. 2 is arranged at least partially on the first printed circuit board 26a here. The current supply line 12a is etched directly onto the first printed circuit board 26a. The current supply line 12a is thus formed by a conductor track of the first printed circuit board 26a. The current supply line 12a thus consists at least essentially of copper. The current supply line 12a has a width 50a between 4 mm and 20 mm. In the present case the current supply line 12a has a width 50a of 10 mm.

The cooking appliance apparatus also has a second printed circuit board 28a. The second printed circuit board 28a has FR4 as its base material. In the present case the second printed circuit board 28a is configured as single-layer. The current sensor unit 10a is arranged on the second printed circuit board 28a here. The first sensor inductance 14a is arranged on the second printed circuit board 28a. The first sensor inductance 14a is etched directly onto the second printed circuit board 28a. The first sensor inductance 14a is thus formed by a conductor track of the second printed circuit board 28a. The second sensor inductance 16a is also arranged on the second printed circuit board 28a. The second sensor inductance 16a is etched directly onto the second printed circuit board 28a. The second sensor inductance 16a is formed by a conductor track of the second printed circuit board 28a. The conduction path 18a is also arranged on the second printed circuit board 28a. The conduction path is soldered directly onto the second printed circuit board 28a. To this end at least two solder points 46a are configured between the conduction path and the second printed circuit board 28a.

The first printed circuit board 26a and the second printed circuit board 28a are also configured as a single piece. To this end the first printed circuit board 26a is connected to the second printed circuit board 28a with a material fit. The first printed circuit board 26a is bonded to the second printed circuit board 28a. The first printed circuit board 26a and the second printed circuit board 28a thus form a common printed circuit board 44a. The printed circuit board 44a is configured as two-layer. The printed circuit board 44a has a thickness between 0.05 mm and 3.1 mm. In the present case the printed circuit board 44a has a thickness of 1.6 mm. The current supply line 12a and the current sensor unit 10a are arranged here on different, in particular opposing, outer surfaces of the printed circuit board 44a. Alternatively a first printed circuit board and a second printed circuit board can also be configured as a single piece and can be produced in particular from a single blank.

The current supply line 12a is arranged relative to the current sensor unit 10a in such a manner that a current flow through the current supply line 12a generates a magnetic field, the field lines of which point in an opposing direction in the first sensor inductance 14a and the second sensor inductance 16a. A signal curve 52a here illustrates a snapshot of a local profile of a magnetic flux strength in the current sensor unit 10a, as generated by a current flow in the current supply line 12a. A distance from the center of gravity center 48a is shown on an abscissa axis here. A magnetic flux density is also shown on an ordinate axis. The signal curve 52a shows that a current flow through the current supply line 12a generates a magnetic field, which induces a voltage in the first sensor inductance 14a, in an opposing direction to an induced voltage in the second sensor inductance 16a. The antiserial connection between the first sensor inductance 14a and the second sensor inductance 16a means that the voltages induced in the sensor inductances 14a, 16a are canceled out.

The current supply line 12a is also arranged in particular centrally, at least when viewed perpendicular to the printed circuit board 44a, between the first sensor inductance 14a and the second sensor inductance 16a. The current supply line 12a is also arranged in proximity to the center of gravity center 48a of a first center of gravity 20a of the first sensor inductance 14a and a second center of gravity 22a of the second sensor inductance 16a. A minimum distance between a cross-sectional center point of 24a of the current supply line 12a and the center of gravity center 48a here is around 1.7 mm. The first center of gravity 20a of the first sensor inductance 14a and the second center of gravity 22a of the second sensor inductance 16a are at an identical distance from the cross-sectional center point 24a of the current supply line 12a here. In this case the distance is between 2 mm and 4 mm. The current sensor unit 10a and in particular the first sensor inductance 14a and the second sensor inductance 16a are provided to measure a high-frequency current, in particular an alternating current, in the current supply line 12a. An electric voltage induced in the first sensor inductance 14a and in the second sensor inductance 16a is measured in order to measure said high-frequency alternating current.

Alternatively a current supply line and a current sensor unit can also be arranged on a printed circuit board, in particular on the same side, in particular an outer surface, of the printed circuit board. Also just one current sensor unit and/or one current supply line could be arranged on a printed circuit board. It is also conceivable that a current supply line is arranged detached from a printed circuit board in proximity to a current sensor unit and passes the current sensor unit at a distance from the printed circuit board. What is known as a jumper could be used for this purpose.

FIGS. 5 to 9 show further exemplary embodiments of the invention. The descriptions which follow and the drawings are essentially restricted to the differences between the exemplary embodiments, it being possible in principle to refer to the drawings and/or the description of the other exemplary embodiments, in particular FIGS. 1 to 4, for identically marked parts, in particular for parts with identical reference characters. The letter a is used after the reference characters of the exemplary embodiment in FIGS. 1 to 4 to differentiate the exemplary embodiments. The letter a is replaced by the letters b and c in the exemplary embodiments in FIGS. 5 to 9.

Figure 5:
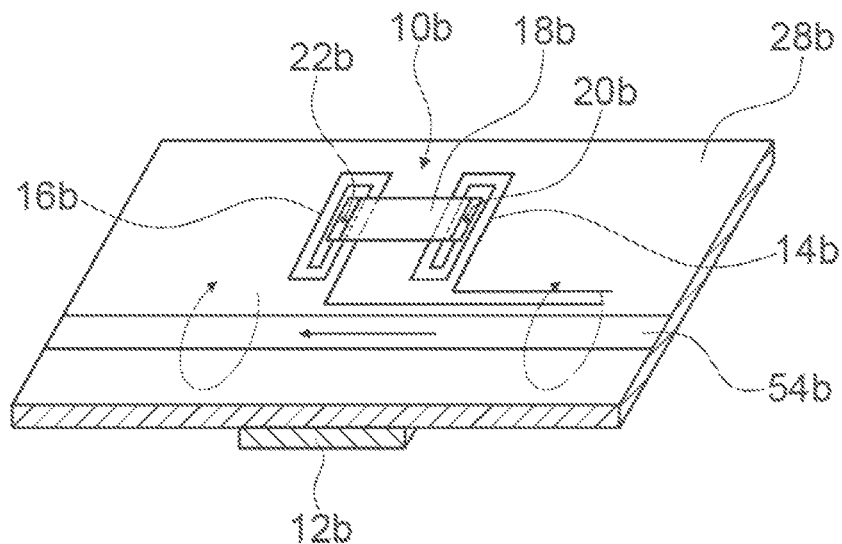
FIG. 5 shows a schematic representation of a first external current conductor with a current sensor unit of a further inventive cooking appliance apparatus.

FIG. 5 shows a further exemplary embodiment of an inventive cooking appliance apparatus. The exemplary embodiment differs from the preceding exemplary embodiment in that a current sensor unit 10b is used. The current sensor unit 10b has a first sensor inductance 14b. The first sensor inductance 14b is configured as a coil, in particular as a flat coil. In the present case the first sensor inductance 14b has around 2 windings. The current sensor unit 10b has a second sensor inductance 16b. The first sensor inductance 14b and the second sensor inductance 16b are configured identically. The current sensor unit 10b is arranged on a second printed circuit board 28b. A current supply line 12b is arranged on a first printed circuit board 26b which is only shown schematically and which can be in particular configured at least partially as a single piece with the second printed circuit board 28b. A first external current conductor 54b is also arranged on the first printed circuit board 26b and/or the second printed circuit board 28b. A current, which flows through the external current conductor 54b, is different from the high-frequency current, in particular the high-frequency current measured and/or detected by the current sensor unit 10b, here. In the present case the first external current conductor 54b is arranged on the first printed circuit board 26b and/or the second printed circuit board 28b in such a manner that a minimum distance between a longitudinal extension of the first external current conductor 54b to a first center of gravity 20b of the first sensor inductance 14b and a second center of gravity 22b of the second sensor inductance 16b is identical. The first external current conductor 54b here is arranged perpendicular to the current supply line 12b.

A current flow through the first external current conductor 54b generates a magnetic field, the field lines of which point in an identical direction in the first sensor inductance 14b and the second sensor inductance 16b. As the first sensor inductance 14b and the second sensor inductance 16b have identical inductance values, a magnetic flux strength generated by a current flow through the first external current conductor 54b induces in particular induction voltages of identical size in the sensor inductances 14b, 16b. An antiserial connection between the first sensor inductance 14b and the second sensor inductance 16b means that the induction voltages are canceled out.

Figure 6:
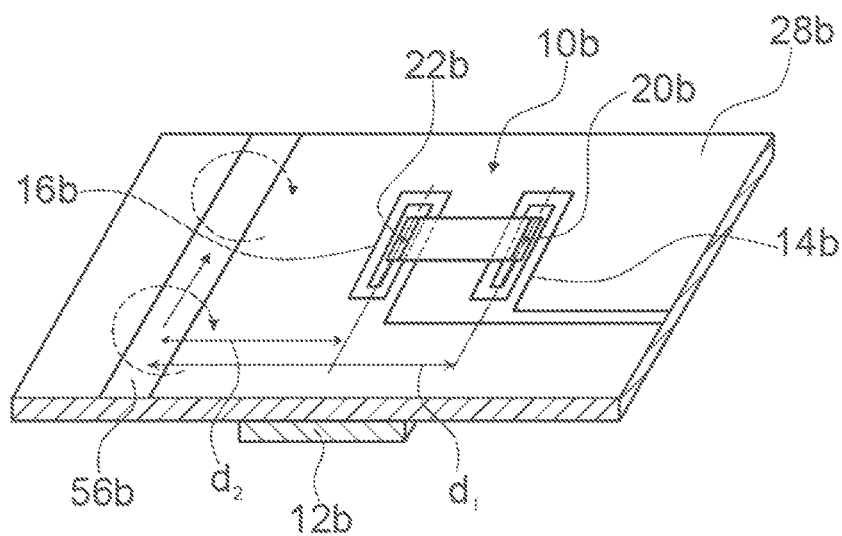
FIG. 6 shows a schematic representation of a second external current conductor with the current sensor unit from FIG. 5.

FIG. 6 shows a second external current conductor 56b, which is arranged in particular on the first printed circuit board 26b and/or the second printed circuit board 28b. In the present case the second external current conductor 56b is arranged on the first printed circuit board 26b and/or the second printed circuit board 28b in such a manner that a first minimum distance $d_1$ between a longitudinal extension of the second external current conductor 56b to the first center of gravity 20b of the first sensor inductance 14b is constant at least over a subregion of the second external current conductor 56b. A second minimum distance $d_2$ between the longitudinal extension of the second external current conductor 56b to a second center of gravity 22b of the second sensor inductance 16b is also constant at least over a subregion of the second external current conductor 56b. The first minimum distance $d_1$ here is different from the second minimum distance $d_2$.

A current flow through the second external current conductor 56b generates a magnetic field, the field lines of which point in an identical direction in the first sensor inductance 14b and the second sensor inductance 16b. As the first sensor inductance 14b and the second sensor inductance 16b have identical inductance values, a magnetic flux strength generated by a current flow through the second external current conductor 56b induces in particular induction voltages of at least essentially identical size in the sensor inductances 14b, 16b. An antiserial connection between the first sensor inductance 14b and the second sensor inductance 16b means that the induction voltages are at least essentially canceled out.

Figure 7:
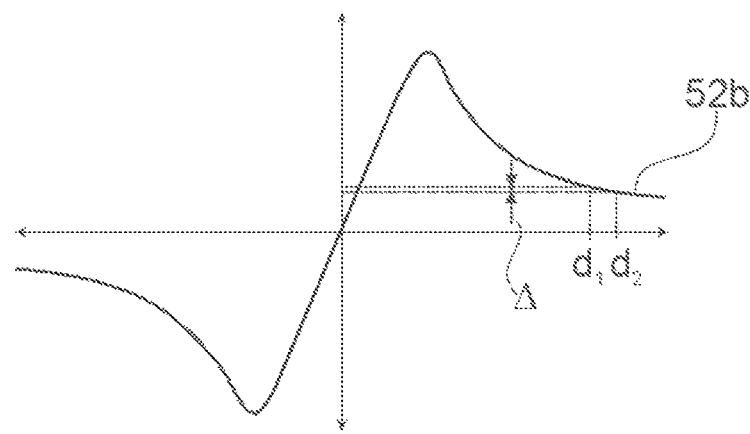
FIG. 7 shows a diagram of a profile of a magnetic flux strength generated by a current flow in the second external current conductor.

In FIG. 7 a signal curve 52b shows a snapshot of a profile of a magnetic flux strength generated in the current sensor unit 10b by a current flow in the second external current conductor 56b. A distance from a center of gravity center 48b is shown on an abscissa axis. The magnetic flux density is also shown on an ordinate axis. The signal curve 52b shows that the greater the distance is between the second external conductor and the center of gravity center 48b, the greater also the first minimum distance $d_1$ and the second minimum distance $d_2$. Thus a difference 4 between magnetic flux densities at the locations of the first sensor inductance 14b and the second sensor inductance 16b is smaller, the greater the distance between the second external conductor and the center of gravity center 48b. The antiserial connection means that there is at least essentially mutual canceling out of voltages induced in the sensor inductances 14b, 16b.

Figure 8:
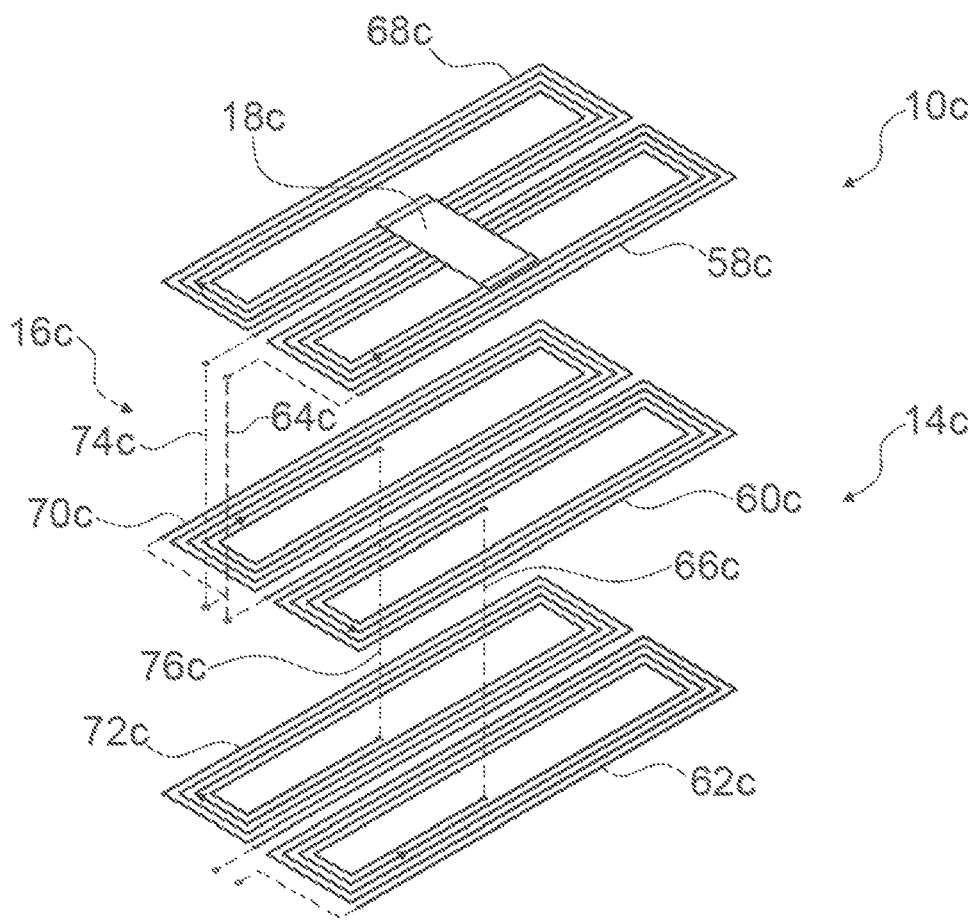
FIG. 8 shows a schematic representation of a further current sensor unit of an alternative cooking appliance apparatus and FIG. 9 shows a schematic sectional representation of the current sensor unit from FIG. 8 arranged on a multilayer printed circuit board.
Figure 9:
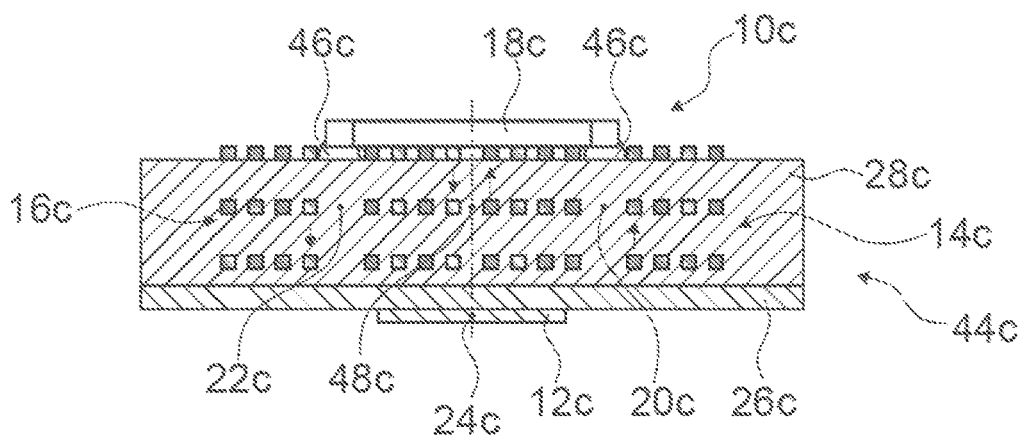

FIGS. 8 and 9 show a further exemplary embodiment of an inventive cooking appliance apparatus. The exemplary embodiment differs from the previous exemplary embodiments in that a sensor unit 10c and a printed circuit board 44c are used. FIG. 8 shows a schematic representation of the current sensor unit 10c. The current sensor unit 10c has a first sensor inductance 14c. The first sensor inductance 14c has three coils 58c, 60c, 62c. The three coils 58c, 60c, 62c have between 4 and 5 windings. The three coils 58c, 60c, 62c are configured identically here. A distance between the three coils 58c, 60c, 62c is around 0.2 mm in each instance.

The first sensor inductance 14c also has a first connecting path 64c. The first connecting path 64c connects the first coil 58c to the second coil 60c in an electrically conducting manner, in particular in series. To this end the first connecting path 64c is connected to an outer end of the first coil 58c. The first connecting path 64c is also connected to an outer end of the second coil 60c. The first sensor inductance 14c also has a second connecting path 66c. The second connecting path 66c connects the second coil 60c to the third coil 62c in an electrically conducting manner, in particular in series. To this end the second connecting path 66c is connected to an inner end of the second coil 60c. The second connecting path 66c is also connected to an inner end of the third coil 62c.

The first coil 58c therefore has a mathematically negative rotation direction, in particular winding direction, when viewed from the inside out. The second coil 60c has a mathematically positive rotation direction, in particular winding direction, when viewed from the inside out. The third coil 62 also has a mathematically negative rotation direction, in particular winding direction, when viewed from the inside out.

Thus a putative current flowing through the three coils 58c, 60c, 62c would have a mathematically identical rotation direction in each coil 58c, 60c, 62c.

The current sensor unit 10c has a second sensor inductance 16c. The second sensor inductance 16c has three coils 68c, 70c, 72c. The three coils 68c, 70c, 72c have between 4 and 5 windings. The three coils 68c, 70c, 72c are configured identically here. A distance between the three coils 68c, 70c, 72c is around 0.2 mm in each instance. In the present case the three coils 58c, 60c, 62c of the first sensor inductance 14c and the three coils 68c, 70c, 72c of the second sensor inductance 16c are configured identically.

The second sensor inductance 16c also has a first connecting path 74c. The first connecting path 74c connects the first coil 68c to the second coil 70c in an electrically conducting manner, in particular in series. To this end the first connecting path 74c is connected to an outer end of the first coil 68c. The first connecting path 74c is also connected to an outer end of the second coil 70c. The second sensor inductance 16c also has a second connecting path 76c. The second connecting path 76c connects the second coil 70c to the third coil 72c in an electrically conducting manner, in particular in series. To this end the second connecting path 76c is connected to an inner end of the second coil 70c. The second connecting path 76c is also connected to an inner end of the third coil 72c.

The first coil 68c has a mathematically negative rotation direction, in particular winding direction, when viewed from the inside out. The second coil 70c has a mathematically positive rotation direction, in particular winding direction, when viewed from the inside out. The third coil 72c also has a mathematically negative rotation direction, in particular winding direction, when viewed from the inside out.

Thus a putative current flowing through the three coils 68c, 70c, 72c would have a mathematically identical rotation direction in each coil 68c, 70c, 72c. Thus a putative current flowing through the two sensor inductances 14c, 16c would have an opposing mathematical rotation direction when there is a hypothetical flow through the at least one first sensor inductance 14c to when there is a hypothetical flow through the at least one second sensor inductance 16c

The current sensor unit 10c also has a conduction path 18c. The conduction path 18c connects the first sensor inductance 14c to the second conductor inductance 16c antiserially, in particular by means of a 0Ω SMD resistor. The conduction path 18c here is connected to an inner end of the first coil 58c of the first sensor inductance 14c. The conduction path 18c is also connected to an inner end of the first coil 68c of the second sensor inductance 16c. Alternatively one of the coils could be thought of as first sensor inductance and one of the coils as second sensor inductance. In this case further coils would form further sensor inductances.

According to FIG. 9 the cooking appliance apparatus has a first printed circuit board 26c. In the present case the first printed circuit board 26c is configured as single-layer. A current supply line 12c is arranged at least partially on the first printed circuit board 26c here.

The cooking appliance apparatus also has a second printed circuit board 28c. In the present case the second printed circuit board 28c is configured as multilayer. The first sensor inductance 14c is arranged on the second printed circuit board 28c. The second sensor inductance 16c is arranged on the second printed circuit board 28c. The first sensor inductance 14c and the second sensor inductance 16c are arranged on an identical side of the second printed circuit board 28c. The first coil 58c is etched directly onto an outer layer of the second printed circuit board 28c. The first coil 68c is etched directly onto an outer layer of the second printed circuit board 28c. The two first coils 58c, 68c here are arranged on the same outer layer of the second printed circuit board 28c. The second coil 60c is also etched directly onto an inner layer of the second printed circuit board 28c. The second coil 70c is etched directly onto an inner layer of the second printed circuit board 28c. The two second coils 60c, 70c here are arranged on the same first inner layer of the second printed circuit board 28c. The two second coils 60c, 70c are arranged on the first inner layer which adjoins the outer layer of the second printed circuit board 28c, in particular directly. The third coil 62c is also etched directly onto an inner layer of the second printed circuit board 28c. The third coil 72c is etched directly onto an inner layer of the second printed circuit board 28c. The two third coils 62c, 72c here are arranged on the same second inner layer of the second printed circuit board 28c. The two third coils 62c, 72c are arranged on the second inner layer which adjoins the first inner layer of the second printed circuit board 28c, in particular directly. The conduction path 18c is soldered directly into the outer layer of the second printed circuit board 28c, on which the two first coils 58c, 68c are arranged. To this end at least two solder points 46c are configured between the conduction path 18c and the second printed circuit board 28c.

The first printed circuit board 26c and the second printed circuit board 28c are also configured as a single piece. The first printed circuit board 26c and the second printed circuit board 28c form a common printed circuit board 44c. The printed circuit board 44c is configured as multilayer. The printed circuit board 44c here has a thickness of 3.1 mm. The current supply line 12c is arranged on an outer surface of the printed circuit board 44c opposite the first sensor inductance 14c, the second sensor inductance 16c and the conduction path 18c.

The current supply line 12c is also arranged in proximity to a center of gravity center 48c of a first center of gravity 20c of the first sensor inductance 14c and a second center of gravity 22c of the second sensor inductance 16c. A minimum distance between a cross-sectional center point 24c of the current supply line 12c and the center of gravity center 48c is around 2.5 mm here. The first center of gravity 20c of the first sensor inductance 14c and the second center of gravity 22c of the second sensor inductance 16c are at an identical distance from the cross-sectional center point 24c of the current supply line 12c. The distance in this case is between 3 mm and 5 mm.

The invention claimed is:

1. A cooking appliance apparatus, comprising:
   at least one current supply line;
   at least one inductor;
   at least one inverter, the at least one inverter and the at least one inductor connected by way of the at least one current supply line;
   at least one current sensor unit positioned between the at least one inverter and the at least one inductor and configured to measure a high-frequency current in the at least one current supply line, said at least one current sensor having:
      a first sensor inductance;
      at least one second sensor inductance;
      at least one conduction path separate and distinct from the at least one current supply line, the at least one conduction path connecting the first sensor inductance to the at least one second sensor inductance in an electrically conducting manner, the at least one current supply line opposing the at least one conduction path and arranged between the first sensor inductance and the at least one second sensor inductance,
   wherein the cooking appliance apparatus is constructed in a form of a cooktop apparatus and the at least one current supply line, the at least one inductor, the at least one inverter, and the at least one current sensor unit are disposed therein.

2. The cooking appliance apparatus of claim 1, wherein a first magnetic field, generated by a hypothetical current flow through the first sensor inductance, cancels out a second magnetic field generated by a hypothetical current flow through the at least one second sensor inductance, at least at one point.

3. The cooking appliance apparatus of claim 1, wherein the first sensor inductance and the at least one second sensor inductance have at least essentially identical inductance values.

4. The cooking appliance apparatus of claim 1, wherein the first sensor inductance and the at least one second sensor inductance are at least essentially identical.

5. The cooking appliance apparatus of claim 1, wherein the first sensor inductance and the at least one second sensor inductance are connected antiserially.

6. The cooking appliance apparatus of claim 1, wherein at least one of the first and second sensor inductances has an outer contour which is configured as at least essentially cuboid.

7. The cooking appliance apparatus of claim 1, wherein the at least one current supply line is arranged relative to the at least one current sensor unit in such a manner that a current flow through the at least one current supply line generates a magnetic field having field lines which point in an at least essentially opposing direction in the first sensor inductance and the at least one second sensor inductance.

8. The cooking appliance apparatus of claim 1, wherein a first center of gravity of the first sensor inductance and a second center of gravity of the at least one second sensor inductance are at an at least essentially identical distance from at least one cross-sectional center point of the at least one current supply line.

9. The cooking appliance apparatus of claim 1, further comprising at least one first printed circuit board, said at least one current supply line being arranged at least partially on the at least one first printed circuit board.

10. The cooking appliance apparatus of claim 9, further comprising at least one second printed circuit board, said at least one current sensor unit being arranged at least partially on the at least one second printed circuit board.

11. The cooking appliance apparatus of claim 10, wherein the at least one first printed circuit board and the at least one second printed circuit board are configured as a single piece.

12. A cooking appliance, comprising:
at least one cooking appliance apparatus including at least one current supply line,
at least one inverter and at least one resonance unit connected to the at least one inverter by way of the at least one current supply line, and
at least one current sensor unit positioned between the at least one inverter and the at least one resonance unit and configured to measure a high-frequency current in the at least one current supply line, said at least one current sensor having a first sensor inductance, at least one second sensor inductance, and at least one conduction path separate and distinct from the at least one current supply line, the at least one conduction path connecting the first sensor inductance to the at least one second sensor inductance in an electrically conducting manner and a current conductor perpendicular to the at least one current supply line for generating a magnetic flux which induces induction voltages of identical size in the first sensor inductance and the at least one second sensor inductance, wherein the cooking appliance is constructed in a form of a cooktop and the at least one current supply line, the at least one inverter, the at least one resonance unit, and the at least one current sensor unit disposed therein.

13. The cooking appliance of claim 12, wherein a first magnetic field, generated by a hypothetical current flow through the first sensor inductance, cancels out a second magnetic field generated by a hypothetical current flow through the at least one second sensor inductance, at least at one point.

14. The cooking appliance of claim 12, wherein the first sensor inductance and the at least one second sensor inductance have at least essentially identical inductance values.

15. The cooking appliance of claim 12, wherein the first sensor inductance and the at least one second sensor inductance are at least essentially identical.

16. The cooking appliance of claim 12, wherein the first sensor inductance and the at least one second sensor inductance are connected antiserially.

17. The cooking appliance of claim 12, wherein at least one of the first and second sensor inductances has an outer contour which is configured as at least essentially cuboid.

18. The cooking appliance of claim 12, wherein the at least one current supply line is arranged relative to the at least one current sensor unit in such a manner that a current flow through the at least one current supply line generates a magnetic field having field lines which point in an at least essentially opposing direction in the first sensor inductance and the at least one second sensor inductance.

19. The cooking appliance of claim 12, wherein a first center of gravity of the first sensor inductance and a second center of gravity of the at least one second sensor inductance are at an at least essentially identical distance from at least one cross-sectional center point of the at least one current supply line.

20. The cooking appliance of claim 12, wherein the at least one cooking appliance apparatus includes at least one first printed circuit board, said at least one current supply line being arranged at least partially on the at least one first printed circuit board.

21. The cooking appliance of claim 20, wherein the at least one cooking appliance apparatus includes at least one second printed circuit board, said at least one current sensor unit being arranged at least partially on the at least one second printed circuit board.

22. The cooking appliance of claim 21, wherein the at least one first printed circuit board and the at least one second printed circuit board are configured as a single piece.

23. The cooking appliance of claim 1, further comprising at least one printed circuit board having opposing first and second surfaces, the at least one current supply line being located directly or indirectly on the first surface, and the at least one conduction path being located directly or indirectly on the second surface.

* * * * *